(12) United States Patent
Takahashi et al.

(10) Patent No.: US 10,674,642 B2
(45) Date of Patent: Jun. 2, 2020

(54) ELECTRICAL EQUIPMENT HOUSING

(71) Applicant: TOSHIBA MITSUBISHI-ELECTRIC INDUSTRIAL SYSTEMS CORPORATION, Chuo-ku (JP)

(72) Inventors: Nobuhiro Takahashi, Chuo (JP); Takuo Itami, Chuo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 51 days.

(21) Appl. No.: 15/100,117

(22) PCT Filed: Nov. 29, 2013

(86) PCT No.: PCT/JP2013/082281
§ 371 (c)(1),
(2) Date: May 27, 2016

(87) PCT Pub. No.: WO2015/079586
PCT Pub. Date: Jun. 4, 2015

(65) Prior Publication Data
US 2017/0034958 A1    Feb. 2, 2017

(51) Int. Cl.
*H05K 7/20*        (2006.01)
*F24F 11/30*       (2018.01)
(Continued)

(52) U.S. Cl.
CPC ........... *H05K 7/20945* (2013.01); *F24F 1/56* (2013.01); *F24F 11/30* (2018.01); *H02S 40/32* (2014.12);
(Continued)

(58) Field of Classification Search
CPC . F25D 21/08; F25D 21/006; F25D 2321/1413
See application file for complete search history.

(56) References Cited

U.S. PATENT DOCUMENTS 3,242,686 A * 3/1966 Bowman ............... F25D 23/003
62/184
3,453,837 A * 7/1969 Sandstrom et al. .. F25D 21/006
62/140
(Continued)

FOREIGN PATENT DOCUMENTS

CN    2497206 Y    6/2002
CN    2824517 Y    10/2006
(Continued)

OTHER PUBLICATIONS

Heatcraft Worldwide Refrigeration, "Installations and Operations Manual, Part No. 25008101", p. 3, Aug. 2008.*
(Continued)

*Primary Examiner* — Jonathan Bradford
(74) *Attorney, Agent, or Firm* — Oblon, McClelland, Maier & Neustadt, L.L.P.

(57) ABSTRACT

According to one embodiment, an electrical equipment housing includes a first storage room, an air conditioner, a second storage room, a temperature sensor, and a heater. The first storage room contains a power converter converting electrical power. The air conditioner adjusts a temperature inside the first storage room. The air conditioner includes an indoor unit and an outdoor unit. The indoor unit is provided inside the first storage room. The outdoor unit is provided outside the first storage room. The second storage room contains the outdoor unit. The temperature sensor senses a temperature inside the second storage room. The heater heats inside the second storage room when the temperature sensed by the temperature sensor is a lower limit or less.

10 Claims, 8 Drawing Sheets

(51) Int. Cl.
*F24F 1/56* (2011.01)
*H02S 40/34* (2014.01)
*H02S 40/32* (2014.01)
*F24F 110/10* (2018.01)
*F24F 13/20* (2006.01)

(52) U.S. Cl.
CPC ......... *H02S 40/345* (2014.12); *H05K 7/2059* (2013.01); *H05K 7/20909* (2013.01); *H05K 7/20936* (2013.01); *F24F 2013/207* (2013.01); *F24F 2110/10* (2018.01); *F24F 2221/34* (2013.01)

(56) References Cited

U.S. PATENT DOCUMENTS

| | | | | |
|---|---|---|---|---|
| 4,004,431 | A * | 1/1977 | Hildreth | F04B 49/10 62/193 |
| 5,623,834 | A * | 4/1997 | Bahel | F25B 49/005 62/131 |
| 6,196,010 | B1 * | 3/2001 | Mohrman | F24F 1/06 62/184 |
| 2011/0016893 | A1 * | 1/2011 | Dawes | F25B 49/02 62/89 |
| 2015/0121934 | A1 * | 5/2015 | Yamaguchi | F24F 1/06 62/275 |
| 2015/0216078 | A1 * | 7/2015 | Edmundsson | H05K 7/2059 361/691 |

FOREIGN PATENT DOCUMENTS

| | | |
|---|---|---|
| JP | 61-256162 A | 11/1986 |
| JP | 5-141707 A | 6/1993 |
| JP | 2005-150433 A | 6/2005 |
| JP | 2005-291558 A | 10/2005 |
| JP | 2008-86087 A | 4/2008 |
| JP | 2011-135643 A | 7/2011 |
| JP | 2013-27188 A | 2/2013 |
| JP | 2013-122358 A | 6/2013 |

OTHER PUBLICATIONS

International Search Report dated Feb. 25, 2014 in PCT/JP2013/082281 filed in Nov. 29, 2013.
Chinese Office Action dated Apr. 3, 2018 in Chinese Patent Application No. 201380081935.0 with English translation, 12 pages.
Office Action dated Dec. 26, 2018 in Chinese Patent Application No. 201380081935.0 (Partial English machine translation).
Chinese Office Action dated May 29, 2019 in Patent Application No. 201380081935.0 (with Partial English machine translation).

* cited by examiner

ELECTRICAL EQUIPMENT HOUSING

FIELD

Embodiments described herein relate generally to an electrical equipment housing.

BACKGROUND

A power converter that performs the conversion of electrical power is one type of electrical equipment. For example, the power converter is used in a photovoltaic power generation system, etc. In the photovoltaic power generation system, the power converter converts direct current power input from a solar cell panel into alternating current power and outputs the alternating current power to an electric power system. Such a power converter is called, for example, a power conditioner.

In the power converter, the heat generation of the devices in the interior in the power conversion is suppressed by cooling the devices by using a fan, etc. Therefore, for a power converter mounted outdoors, the dust, salt, corrosive gas, etc., included inside the external air enters the power converter when is the converter exposed to the air; and the durability of the power converter undesirably decreases.

Therefore, the power converter is contained inside a sealed housing; and the temperature inside the housing is controlled using an air conditioner. Thereby, the exposure of the power converter to the external air can be suppressed; and the decrease of the durability of the power converter can be suppressed. Also, in the case where the temperature control is performed using the air conditioner, it is unnecessary to uselessly enlarge the housing; and the increase of the mounting surface area of the power converter also can be suppressed.

However, in the housing in which the temperature control is performed using the air conditioner, it is necessary to stop the operation of the air conditioner to protect the outdoor unit when the external air temperature becomes a prescribed value or less. Because the temperature of the devices undesirably increases in the case where the operation of the air conditioner is stopped, the operation of the power converter also must be stopped.

Therefore, in an environment where the external air temperature is low such as in a cold district, etc., the power converter cannot be operated. For example, in a photovoltaic power generation system, a state undesirably occurs in which the power converter cannot be operated because the external air temperature is low even though sufficient electrical power is being supplied from the solar cell panel. For example, the power generation efficiency undesirably decreases.

Accordingly, in the electrical equipment housing that contains the power converter, it is desirable for the power converter to be operable even in an environment having a low external air temperature while suppressing the decrease of the durability of the power converter.

CITATION LIST

Patent Literature

[PTL 1]
JP-A 2008-86087

SUMMARY

Technical Problem

Embodiments of the invention provide an electrical equipment housing in which a power converter can be operated even in an environment having a low external air temperature while suppressing the decrease of the durability of the power converter.

Solution to Problem

According to one embodiment, an electrical equipment housing includes a first storage room, an air conditioner, a second storage room, a temperature sensor, and a heater. The first storage room contains a power converter converting electrical power. The air conditioner adjusts a temperature inside the first storage room. The air conditioner includes an indoor unit and an outdoor unit. The indoor unit is provided inside the first storage room. The outdoor unit is provided outside the first storage room. The second storage room contains the outdoor unit. The temperature sensor senses a temperature inside the second storage room. The heater heats inside the second storage room when the temperature sensed by the temperature sensor is a lower limit or less.

Advantageous Effects of Invention

According to the embodiments of the invention, an electrical equipment housing in which a power converter can be operated even in an environment having a low external air temperature while suppressing the decrease of the durability of the power converter is provided.

DESCRIPTION OF EMBODIMENTS

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

Figure 1:
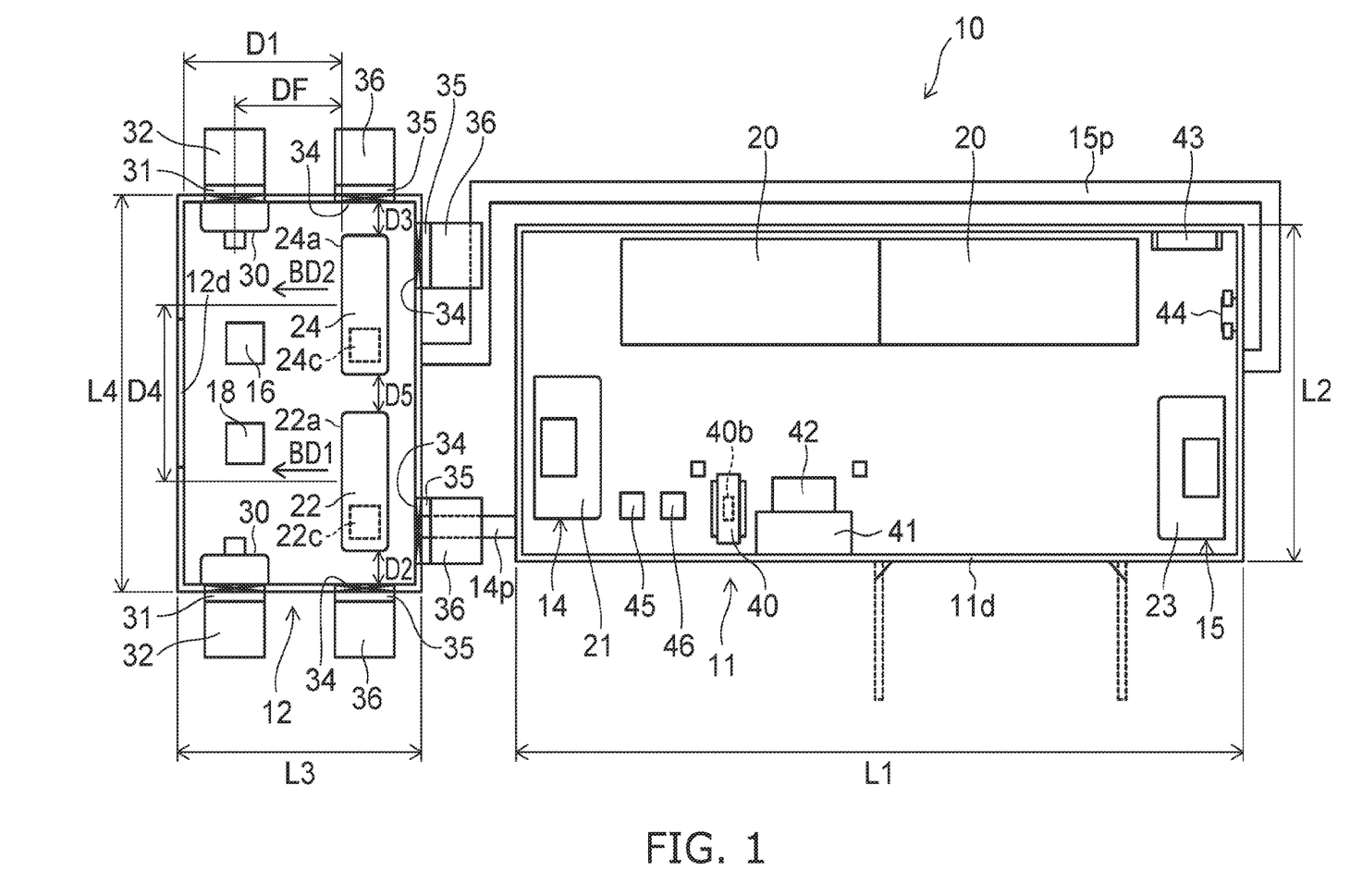
FIG. 1 is a site plan schematically showing an electrical equipment housing according to an embodiment.

FIG. 1 is a site plan schematically showing an electrical equipment housing according to an embodiment.

Figure 2A:
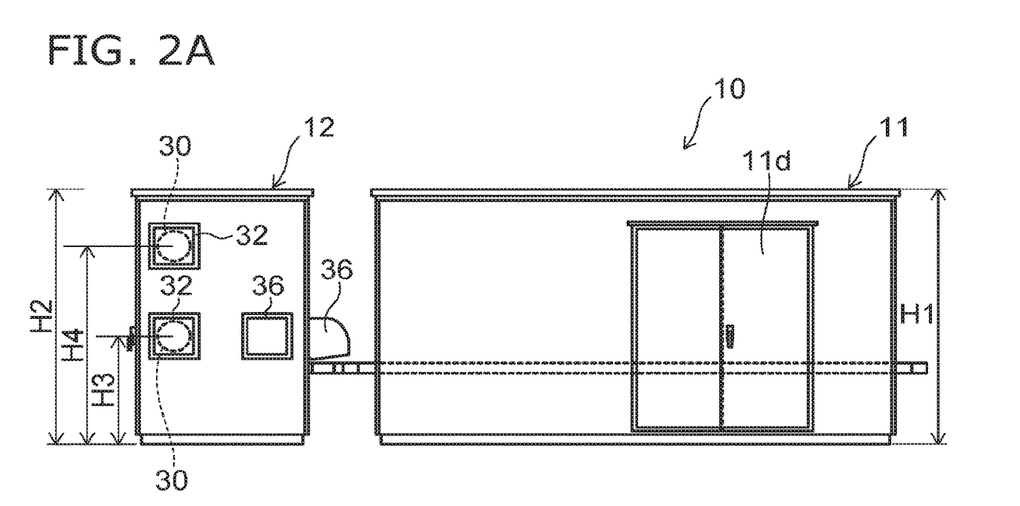
FIG. 2A to FIG. 2C are exterior views schematically showing the electrical equipment housing according to the embodiment.
Figure 2B:
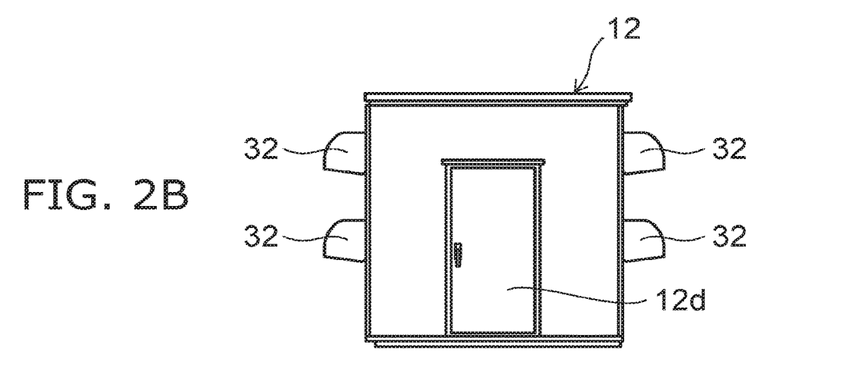
Figure 2C:
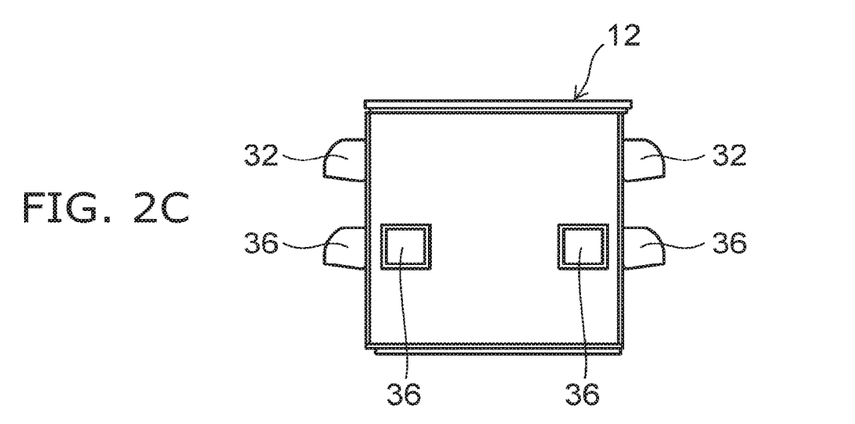

FIG. 2A to FIG. 2C are exterior views schematically showing the electrical equipment housing according to the embodiment.

As shown in FIG. 1 and FIG. 2A to FIG. 2C, the electrical equipment housing 10 (hereinbelow, called the housing 10) includes a first storage room 11, a second storage room 12, air conditioners 14 and 15, a temperature sensor 16, and a heater 18.

The first storage room 11 contains a power converter 20 performing the conversion of electrical power. The power converter 20 is, for example, a power conditioner used in a photovoltaic power generation system. For example, the power converter 20 converts direct current power input from a solar cell panel into alternating current power and outputs the alternating current power to an electric power system. The housing 10 is a so-called enclosure containing the power converter 20.

The power converter 20 is not limited to being used for photovoltaic power generation. The power converter 20 may be, for example, a device that converts direct current power input from a gas turbine engine, a storage battery (a NAS battery), etc., into alternating current power. The power converter 20 may be, for example, a device that converts alternating current power input from a generator of wind power generation, geothermal power generation, etc., into another alternating current power corresponding to the system. Hereinbelow, the case of a photovoltaic power generation system is described as an example.

The first storage room 11 suppresses the penetration of the external air into the space of the interior. The first storage room 11 suppresses the exposure of the power converter 20 to the external air. For example, the first storage room 11 has waterproof/dustproof properties conforming to the specification of IP54. The first storage room 11 protects the power converter 20 from dust, salt, corrosive gas, etc., included inside the air.

In the example, two power converters 20 are provided inside the first storage room 11. The number of the power converters 20 provided inside the first storage room 11 is not limited to two and may be one or may be three or more. It is sufficient for the number of the power converters 20 to be determined according to the power generation amount of the solar cell panel and the capacity of the power converters 20.

The second storage room 12 is arranged with the first storage room 11. In the example, the second storage room 12 is arranged at a side of the first storage room 11. The second storage room 12 may be arranged vertically with respect to the first storage room 11. In other words, the second storage room 12 may be provided on the first storage room 11. The interior space of the second storage room 12 is isolated from the interior space of the first storage room 11. In the example, the second storage room 12 is separated from the first storage room 11. The second storage room 12 may be formed as one body with the first storage room 11. In other words, the first storage room 11 and the second storage room 12 may be formed by partitioning one room using a room divider, etc.

FIG. 1 schematically shows the arrangement of each component provided inside the first storage room 11 and the second storage room 12. FIG. 2A is a front view of the housing 10. FIG. 2B is a side view schematically showing a side surface of the second storage room 12 facing the opposite side of the first storage room 11. FIG. 2C is a side view schematically showing a side surface of the second storage room 12 opposing the first storage room 11.

In the example, the first storage room 11 and the second storage room 12 are substantially rectangular parallelepiped box configurations. A length L1 of one side of the first storage room 11 is, for example, 5.4 m. A length L2 of one other side of the first storage room 11 is, for example, 2.3 m. A height H1 of the first storage room 11 is, for example, 2.9 m. A length L3 of one side of the second storage room 12 is, for example, 1.8 m. A length L4 of one other side of the second storage room 12 is, for example, 2.7 m. A height H2 of the second storage room 12 is, for example, 2.9 m. The first storage room 11 and the second storage room 12 include, for example, a metal material such as aluminum, etc. The configurations and materials of the first storage room 11 and the second storage room 12 may be arbitrary. Also, in the first storage room 11 and the second storage room 12, insulation is provided between the exterior walls and the interior walls. Thereby, the space of the interiors of the first storage room 11 and the second storage room 12 are thermally insulated.

A door 11d is provided in the front surface of the first storage room 11. The interior space of the first storage room 11 can be opened or closed by the door 11d. The first storage room 11 can be entered by opening the door 11d. A door 12d is provided in the side surface of the second storage room 12 facing the opposite side of the first storage room 11. Similarly to the first storage room 11, the interior space of the second storage room 12 can be opened or closed by the door 12d. For example, the installing/removing of devices into and from the first storage room 11 and the second storage room 12 is performed via the door 11d and the door 12d.

The air conditioner 14 includes an indoor unit 21 and an outdoor unit 22. The indoor unit 21 is provided inside the first storage room 11. The outdoor unit 22 is provided outside the first storage room 11. The air conditioner 15 includes an indoor unit 23 and an outdoor unit 24. The indoor unit 23 is provided inside the first storage room 11. The outdoor unit 24 is provided outside the first storage room 11. The air conditioners 14 and 15 adjust the temperature inside the first storage room 11.

The indoor unit 21 is provided at one end in the longitudinal direction of the first storage room 11 having the rectangular parallelepiped configuration. The indoor unit 23 is provided at the other end in the longitudinal direction of the first storage room 11. In other words, the indoor unit 23 is provided on the opposite side of the indoor unit 21 in the interior space of the first storage room 11. The blowing direction of the indoor unit 23 is opposite to the blowing direction of the indoor unit 21. The indoor units 21 and 23 blow air toward each other toward the center of the first storage room 11. The two power converters 20 are disposed between the indoor units 21 and 23. Thereby, the temperature inside the first storage room 11 can be adjusted efficiently by the indoor units 21 and 23. For example, the indoor units 21 and 23 may be mounted to the ceiling surface of the first storage room 11.

The air conditioners 14 and 15 send cooling air into the first storage room 11. The air conditioners 14 and 15 cool inside the first storage room 11 and suppress the temperature increase of the power converters 20. In other words, the air conditioners 14 and 15 are coolers. For example, the air conditioners 14 and 15 cause the temperature inside the first storage room 11 to be 30° C. or less. For example, the air conditioners 14 and 15 start operating when the temperature inside the first storage room 11 becomes higher than 30° C. (a first temperature) and stop operating when the temperature inside the first storage room 11 decreases to 25° C. (a second temperature). The first temperature is not limited to 30° C. and may be any temperature. The second temperature may be any temperature lower than the first temperature. For example, in the case where the temperature inside the first storage room 11 is low, warm air may be output from the indoor units 21 and 23 to heat inside the first storage room 11.

In the example, the two air conditioners 14 and 15 are provided in the housing 10. The number of air conditioners is not limited to two and may be one or may be three or more. For example, it is sufficient for the number of air conditioners to be determined according to the amount of heat generated by the power converters 20, the cooling capacity of the air conditioners, etc.

The indoor unit 21 and the outdoor unit 22 are connected via a pipe 14p. For example, two pipes for circulating a coolant between the indoor unit 21 and the outdoor unit 22 are provided inside the pipe 14p. The outdoor unit 22 includes a compressor 22c. The air conditioner 14 is, for example, a remote condensing unit-type. The outdoor unit 22 further includes, for example, a heat exchanger (a condenser), a fan, etc. The indoor unit 21 includes, for example, a heat exchanger (an evaporator), a fan, an expansion valve, etc.

The indoor unit 23 and the outdoor unit 24 are connected via a pipe 15p. The outdoor unit 24 includes a compressor 24c. The configuration of the air conditioner 15 is substantially the same as that of the air conditioner 14; and a detailed description is therefore omitted. The air conditioner may be, for example, a multi-type in which multiple indoor units are connected to one outdoor unit.

The outdoor units 22 and 24 are provided inside the second storage room 12. The second storage room 12 contain the outdoor units 22 and 24. In the example, the outdoor units 22 and 24 of the two air conditioners 14 and 15 are arranged inside the second storage room 12.

Thus, in the housing 10, the power converters 20 and the indoor units 21 and 23 are provided inside the first storage room 11; and the outdoor units 22 and 24 are provided inside the second storage room 12. The configuration of the first storage room 11 may be any configuration in which the power converters 20 and the indoor units 21 and 23 are storable. The configuration of the second storage room 12 may be any configuration in which the outdoor units 22 and 24 are storable.

The two outdoor units 22 and 24 are arranged inside the second storage room 12 to face substantially the same direction. The direction in which a front surface 24a of the outdoor unit 24 faces is substantially the same as the direction in which a front surface 22a of the outdoor unit 22 faces. The front surfaces 22a and 24a are the surfaces where the outlets of the outdoor units 22 and 24 are provided. In other words, in the example, the blowing direction of the outdoor unit 24 illustrated by arrow BD2 is substantially the same as the blowing direction of the outdoor unit 22 illustrated by arrow BD1. Hereinbelow, the blowing direction of the outdoor unit 22 is called the blowing direction BD1; and the blowing direction of the outdoor unit 24 is called the blowing direction BD2.

The position of the front surface 24a of the outdoor unit 24 in the blowing direction BD2 is substantially the same as the position of the front surface 22a of the outdoor unit 22 in the blowing direction BD1. In other words, the front surface 24a is positioned in substantially the same plane as the front surface 22a.

The temperature sensor 16 is provided inside the second storage room 12. The temperature sensor 16 senses the temperature inside the second storage room 12. The temperature sensor 16 may be any sensor that can sense the temperature.

The heater 18 is provided inside the second storage room 12. The heater 18 heats inside the second storage room 12 when the temperature sensed by the temperature sensor 16 is a lower limit or less. For example, the heater 18 heats inside the second storage room 12 when the temperature sensed by the temperature sensor 16 is −15° C. or less.

For example, in a general-purpose air conditioner, the lower limit temperature of the cooling operation is −15° C. This is to protect the device of the outdoor unit. For example, if the external air temperature becomes −15° C. or less for the general-purpose air conditioner, a so-called refrigerant floodback phenomenon occurs in which the coolant that circulates through the air conditioner undesirably enters the compressor as a liquid without vaporizing. Such a refrigerant floodback phenomenon causes failure of the compressor.

The refrigerant floodback phenomenon can be suppressed if the cause of the obstruction of the gasification of the coolant is removed. However, in the case of outdoor mounting, because the individual environmental factors are large, it is difficult to determine beforehand which type of countermeasure would be most effective. Also, if an air conditioner dedicated to performing the low temperature countermeasure is used, for example, this undesirably causes the increase of the manufacturing cost of the electrical equipment housing. Further, the introduction of the external air causes the durability of the power converter to decrease due to the effects of salt damage, corrosive gas, etc.

Therefore, in the case where the external air temperature becomes −15° C. or less in a cold district, etc., it has been difficult to operate the power converter mounted inside the electrical equipment housing. The operation stop of the power converter due to such air temperatures causes the power generation efficiency to decrease. Accordingly, in the electrical equipment housing that contains the power converter, it is desirable for the power converter to be operable even in an environment having a low external air temperature while suppressing the decrease of the durability of the power converter.

Conversely, in the housing 10 according to the embodiment, the outdoor units 22 and 24 are contained inside the second storage room 12; and the interior of the second storage room 12 is heated by the heater 18 when the temperature sensed by the temperature sensor 16 is the lower limit or less. Thereby, in the housing 10, for example, the ambient temperature of the outdoor units 22 and 24 becoming −15° C. or less can be suppressed. For example, the occurrence of the refrigerant flood back phenomenon in the outdoor units 22 and 24 can be suppressed. Accordingly, in the housing 10 according to the embodiment, the power converters 20 can be operated even in an environment having a low external air temperature while suppressing the decrease of the durability of the power converters 20.

Also, the snowfall amount is relatively large in cold districts. Therefore, in a housing in which the outdoor unit is exposed to the outside, for example, countermeasures for snowfall are necessary such as mounting the outdoor unit at a high position by raising the floor, mounting a snowproof duct on the outdoor unit, etc. Conversely, in the housing 10 according to the embodiment, such countermeasures for snowfall are unnecessary because the outdoor units 22 and 24 are contained inside the second storage room 12. For example, the effects of snowfall on the outdoor units 22 and 24 such as the outlets being obstructed with snow can be suppressed more appropriately.

A distance D1 from the front surface 22a of the outdoor unit 22 to the opposing wall surface of the second storage room 12 is, for example, 1180 mm. If the distance D1 is short, for example, the hot air that is exhausted from the outdoor unit 22 again is sucked in by the outdoor unit 22; and the cooling efficiency of the air conditioner 14 undesirably decreases. Therefore, the distance D1 is set to be 1000 mm or more. Thereby, the intake of the exhausted hot air can be suppressed. The distance from the front surface 24a of the outdoor unit 24 to the opposing wall surface of the second storage room 12 is substantially the same as the distance D1. The distance from the front surface 24a of the outdoor unit 24 to the opposing wall surface of the second storage room 12 is 1000 mm or more.

A distance D2 between the side surface of the outdoor unit 22 and the wall surface of the second storage room 12 is, for example, 260 mm. A distance D3 between the side surface of the outdoor unit 24 and the wall surface of the second storage room 12 is, for example, 260 mm. The distance D3 is substantially the same as the distance D2. The distances D2 and D3 are set to be 200 mm or more. Thereby, the hot air exhausted from the outdoor units 22 and 24 flowing around from the side can be suppressed.

A distance D4 between the centers of the outdoor units 22 and 24 in the direction in which the outdoor units 22 and 24 are arranged is, for example, 1196 mm. A distance D5 between the outdoor unit 22 and the outdoor unit 24 is, for example, 300 mm. The distance D4 is set to be 1000 mm or more. Or, the distance D5 is set to be 300 mm or more. Thereby, for example, the undesirable re-intake of the hot air exhausted from one of the outdoor unit 22 or 24 by the other of the outdoor unit 22 or 24 can be suppressed.

The second storage room 12 further includes a ventilation fan 30. The ventilation fan 30 performs ventilation inside the second storage room 12 when the temperature sensed by the temperature sensor 16 is an upper limit or more. The ventilation fan 30 exhausts the air inside the second storage room 12 outside the second storage room 12. The ventilation fan 30 is, for example, a pressure ventilation fan.

For example, the ventilation fan 30 performs ventilation inside the second storage room 12 when the temperature inside the second storage room 12 sensed by the temperature sensor 16 is 25° C. or more. Thereby, for example, the temperature inside the second storage room 12 undesirably reaching the upper limit temperature of the outdoor units 22 and 24 can be suppressed. For example, the decrease of the cooling efficiency of the air conditioners 14 and 15 can be suppressed.

In the example, a total of four ventilation fans 30 are provided, i.e., the two ventilation fans 30 provided at the front surface of the second storage room 12 and the two ventilation fans 30 provided at the back surface of the second storage room 12. The two ventilation fans 30 that are provided at the front surface are arranged in the vertical direction. Similarly, the two ventilation fans 30 that are provided at the back surface are arranged in the vertical direction. A height H3 of the center of the ventilation fan 30 provided on the lower side is, for example, 1215 mm (1000 mm or more). A height H4 of the center of the ventilation fan 30 provided on the upper side is, for example, 2241 mm (2000 mm or more).

The ventilation fans 30 are disposed frontward of the outdoor units 22 and 24 in the blowing directions BD1 and BD2 of the outdoor units 22 and 24. Thereby, for example, when operating the ventilation fans 30, the exhaust of the outdoor units 22 and 24 can be exhausted appropriately to the outside from the ventilation fans 30. For example, the intake of the exhausted hot air by the outdoor units 22 and 24 can be suppressed more appropriately. A distance DF is, for example, 760 mm between the centers of each of the ventilation fans 30 and the front surfaces 22a and 24a of the outdoor units 22 and 24 in the blowing directions BD1 and BD2.

The number of the ventilation fans 30 is not limited to four and may be three or more or may be five or more. It is sufficient for the number of the ventilation fans 30 to be determined according to the heat generation amount of the outdoor units 22 and 24, the exhaust air amount of the ventilation fan 30, etc. Also, the disposition of the ventilation fan 30 is not limited to the description recited above and may be any position where the ventilation inside the second storage room 12 can be performed appropriately.

A pressure shutter 31 and a hood 32 are provided at the opening portion of the ventilation fan 30. The pressure shutter 31 and the hood 32 are provided at each of the multiple ventilation fans 30. The pressure shutter 31 is opened by the wind pressure of the ventilation fan 30 when operating the ventilation fan 30; and the opening portion of the ventilation fan 30 is closed by closing when the ventilation fan 30 is stopped. For example, the pressure shutter 31 suppresses the entrance of the external air into the second storage room 12 from the opening portion of the ventilation fan 30 when the ventilation fan 30 is stopped.

The hood 32 is mounted at the outer surface of the second storage room 12. The hood 32 is a pipe bent into a substantially L-shaped configuration. The hood 32 causes the opening to face downward and suppresses the entrance of wind, rain, etc., into the opening portion of the ventilation fan 30.

The second storage room 12 further includes an intake and a shutter 35. The intake 34 is an opening for introducing the external air into the second storage room 12. The shutter 35 opens the intake 34 when operating the ventilation fan 30 and closes the intake 34 when the ventilation fan 30 is stopped. Thereby, the ventilation inside the second storage room 12 can be performed more appropriately; and the entrance of the external air into the second storage room 12 from the intake 34 when the ventilation fan 30 is stopped can be suppressed.

The shutter 35 is, for example, an electric shutter including a power source such as a motor, an actuator, etc., that transitions between an open state in which the intake 34 is opened and a closed state in which the intake 34 is closed according to the supply of the electrical power.

In the example, a total of four intakes 34 and shutters 35 are provided, i.e., one at each of the front surfaces of the second storage room 12, one at each of the back surfaces of the second storage room 12, and two at each of the side surfaces of the second storage room 12 opposing the first storage room 11.

The intake 34 and the shutter 35 are disposed rearward of the outdoor units 22 and 24 in the blowing directions BD1 and BD2 of the outdoor units 22 and 24. More specifically, the intake 34 and the shutter 35 are disposed rearward of the front surface 22a of the outdoor unit 22 and the front surface 24a of the outdoor unit 24 in the blowing directions BD1 and BD2.

Thus, the outdoor units 22 and 24 are disposed between the ventilation fan 30 and the intake 34 in the blowing directions BD1 and BD2. Thereby, for example, when operating the ventilation fans 30, the exhaust of the outdoor units 22 and 24 can be exhausted from the ventilation fans 30 to the outside more appropriately. For example, the intake of the exhausted hot air by the outdoor units 22 and 24 can be suppressed more appropriately. For example, the position in the height direction of the center of the intake 34 is substantially the same as the height H3 of the center of the ventilation fan 30 provided on the lower side.

The numbers of the intakes 34 and the shutters 35 are not limited to four and may be three or more or may be five or more. For example, it is sufficient for the numbers of the intakes 34 and the shutters 35 to be determined according to the exhaust air amount of the ventilation fans 30, etc. Also, the positions of the intake 34 and the shutter 35 are not limited to the description recited above and may be any position where the ventilation inside the second storage room 12 can be performed appropriately.

A hood 36 is provided at the intake 34. The hood 36 is provided at each of the multiple intakes 34. The configuration and function of the hood 36 is substantially the same as that of the hood 32 provided at the opening portion of the ventilation fan 30; and a detailed description is therefore omitted.

An uninterruptible power supply 40, a circuit breaker panel 41, a transformer panel 42, a control panel 43, a ground terminal board 44, a temperature sensor 45, and a heater 46 are further provided inside the first storage room 11.

The uninterruptible power supply 40 includes a battery 40b and supplies electrical power for a constant amount of time to the power converters 20, etc., when, for example, the electrical power supply from the system side is interrupted.

The circuit breaker panel 41 includes multiple breakers. The electrical power that is supplied from the outside is supplied to each component inside the housing 10 via the breakers provided in the circuit breaker panel 41. The circuit breaker panel 41 distributes the electrical power supplied from the outside to each component inside the housing 10 and protects each component inside the housing 10 from overcurrent, etc., by the breakers.

The transformer panel 42 includes a transformer that performs conversion of the alternating current power. For example, multiple transformers are provided in the transformer panel 42. For example, the control panel 43 performs the control of each component inside the housing 10, communication with the external devices, etc. For example, the ground terminal board 44 is electrically connected to an exterior metal plate of the housing 10. The ground terminal board 44 is used as a frame earth.

The temperature sensor 45 senses the temperature inside the first storage room 11. The temperature sensor 45 is, for example, a temperature switch that includes a bi-metallic strip and switches a contact ON/OFF due to the temperature inside the first storage room 11.

The heater 46 heats inside the first storage room 11 when the temperature sensed by the temperature sensor 45 is a prescribed value or less.

Figure 3:
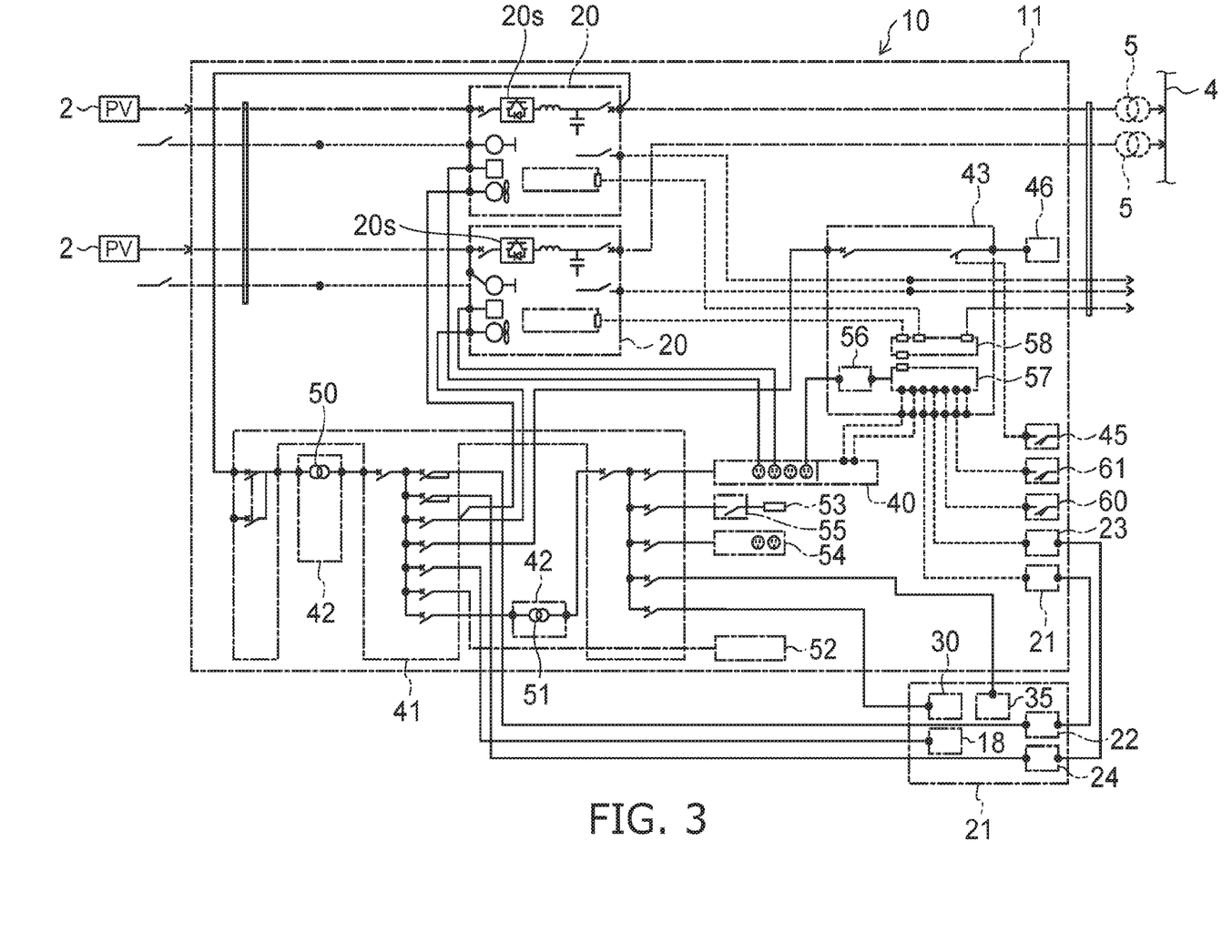
FIG. 3 is a functional block diagram schematically showing the power supply system of the electrical equipment housing according to the embodiment.

FIG. 3 is a functional block diagram schematically showing the power supply system of the electrical equipment housing according to the embodiment.

As shown in FIG. 3, the power converter 20 is connected to a solar cell panel 2 and an electric power system 4. For example, the power converter 20 is removably connected to the solar cell panel 2 and the electric power system 4 by connectors, etc.

The electric power system 4 is, for example, a power line for supplying electrical power to the power receiving equipment of a demander. The electrical power that is supplied by the electric power system 4 is alternating current. For example, the electric power system 4 is the power line of a commercial power source. The electrical power of the electric power system 4 is, for example, three-phase 210 V (effective value) alternating current power. The electrical power of the electric power system 4 may be single-phase 100 V (effective value) alternating current power. Hereinbelow, the example of three-phase 210 V is described. The frequency of the alternating current power of the electric power system 4 is, for example, 50 Hz or 60 Hz. The electric power system 4 may be, for example, a power line inside a home power generation system, etc.

The power converter 20 includes, for example, a switching element 20s and converts a direct current voltage into an alternating current voltage by the ON/OFF of the switching element 20s. The power converter 20 converts the direct current power supplied from the solar cell panel 2 into alternating current power by the ON/OFF of the switching element 20s and outputs the alternating current power to the electric power system 4. For example, a self arc-extinguishing type element is included in the switching element 20s of the power converter 20. More specifically, for example, a GTO (Gate Turn-Off thyristor), a MOS-FET (Metal-Oxide-Semiconductor Field-Effect Transistor), an IGBT (Insulated Gate Bipolar Transistor), or the like is used.

For example, the power converter 20 is electrically connected to the electric power system 4 via a transformer 5. For example, the transformer 5 converts the alternating current power output from the power converter 20 into alternating current power corresponding to the electric power system 4. For example, the transformer 5 electrically insulates the power converter 20 and the electric power system 4.

The transformer panel 42 includes, for example, transformers 50 and 51. The transformer 50 is connected to the output side of the power converter 20 via breakers provided in the circuit breaker panel 41. The electrical power of the electric power system 4 is supplied to the transformer 50. For example, the transformer 50 converts three-phase 210 V alternating current power into single-phase 210 V alternating current power.

The output of the transformer 50 is connected, via breakers provided in the circuit breaker panel 41, to the outdoor unit 22, the outdoor unit 24, the power converter 20, the heater 46, the heater 18, a communication device 52, and the transformer 51.

The outdoor units 22 and 24 and the heaters 18 and 46 are operated by the electrical power supply from the transformer 50. Also, the output of the transformer 50 is supplied to the indoor units 21 and 23 via the outdoor units 22 and 24. Thereby, the indoor units 21 and 23 operate.

For example, the power converter 20 drives a fan provided in the interior by the electrical power supplied from the transformer 50. The communication device 52 is driven by the electrical power supply from the transformer 50 and performs communication with the external devices. For example, the communication device 52 measures and monitors the voltage, current, and power generation amount of the solar cell panel 2, the device state of the power converter 20, etc., and transmits the acquired data to external devices.

For example, the transformer 51 converts the single-phase 210 V alternating current power into single-phase 100 V alternating current power. The output of the transformer 51 is connected, via breakers provided in the circuit breaker panel 41, to the uninterruptible power supply 40, lighting 53, a plug socket 54, the ventilation fan 30, and the shutter 35. Although the illustration in FIG. 3 is simplified, the transformer 51 is connected to each of four ventilation fans 30 and four shutters 35.

For example, the uninterruptible power supply 40 converts the single-phase 100 V alternating current power supplied from the transformer 51 into direct current power, charges the built-in battery 40b, converts the stored direct current power into single-phase 100 V alternating current power, and outputs the single-phase 100 V alternating current power. Thereby, the uninterruptible power supply 40 drives the devices connected to the uninterruptible power supply 40 for a prescribed time even in the case where the electrical power supply from the electric power system 4 is interrupted. Also, for example, the uninterruptible power supply 40 suppresses the effects of instantaneous voltage drops of the electric power system 4.

The lighting 53 is connected to the output side of the transformer 51 via a switch 55. The switch 55 switches between the supply of the electrical power to the lighting 53 and stopping the electrical power supply. The lighting 53 and the switch 55 are provided inside the first storage room 11. The lighting 53 is, for example, an indoor lamp that illuminates inside the first storage room 11. The lighting 53 may be, for example, an outdoor lamp that illuminates outside the first storage room 11.

The plug socket 54 has insertion holes for inserting a plug and supplies electrical power to the inserted device. The ventilation fan 30 and the shutter 35 are operated by the electrical power supply from the transformer 51.

The output of the uninterruptible power supply 40 is connected to the power converter 20 and the control panel 43. For example, the power converter 20 performs the control of the power conversion by the electrical power supplied from the uninterruptible power supply 40. Thereby, the undesirable abrupt stop of the operation of the power converter 20 due to the stop of the electrical power supply from the electric power system 4, an instantaneous voltage drop, etc., can be suppressed.

The control panel 43 includes an AC-DC converter 56, an input/output interface 57, and a media converter 58. The AC-DC converter 56 is connected to the uninterruptible power supply 40. The AC-DC converter 56 converts the alternating current power supplied from the uninterruptible power supply 40 into direct current power and supplies the direct current power to the input/output interface 57 and the media converter 58.

The input/output interface 57 is connected to the uninterruptible power supply 40, the indoor units 21 and 23, a door switch 60, a temperature sensor 61, and the media converter 58. The door switch 60 senses the opening and closing of the door 11d of the first storage room 11. The temperature sensor 61 senses whether or not the temperature inside the first storage room 11 is a high temperature. For example, the temperature sensor 61 senses whether or not the temperature inside the first storage room 11 is 30° C. or more. For example, the temperature sensor 61 is a temperature switch that switches a contact ON/OFF when the temperature inside the first storage room 11 becomes a prescribed value or more. For example, the air conditioners 14 and 15 start to operate according to the sensing of the temperature sensor 61. After the air conditioners 14 and 15 start to operate, for example, the temperature inside the first storage room 11 is sensed by the temperature sensor provided in the interior measuring the intake temperature of the indoor units 21 and 23.

The uninterruptible power supply 40 inputs, to the input/output interface 57, a failure detection signal indicating a failure of the uninterruptible power supply 40, and a battery voltage drop signal indicating that the battery voltage of the uninterruptible power supply 40 has decreased to the prescribed value or less. The door switch 60 inputs, to the input/output interface 57, a door open/close signal indicating the opening of the door 11d. The indoor units 21 and 23 input, to the input/output interface 57, an air conditioning failure signal indicating a failure of the air conditioners 14 and 15. The input/output interface 57 outputs, to the media converter 58, these signals that are input.

The media converter 58 is connected to the input/output interface 57 and each of the power converters 20. The power converter 20 inputs, to the media converter 58, various signals indicating the device state of the power converter 20. Also, the media converter 58 is connected to the transmission path for performing communication with the external devices. The transmission path is, for example, a path included in a portion of a network such as the Internet, etc. The media converter 58 converts the various signals input from the input/output interface 57 and each of the power converters 20 into signals having a format corresponding to the transmission path and outputs the signals to the transmission path. For example, the media converter 58 converts electrical signals input via a metal cable into optical signals and outputs the optical signals to the transmission path.

Thereby, the states of the housing 10 and/or the power converters 20 can be monitored by external devices via the network. Also, the electrical power from the uninterruptible power supply 40 is supplied to the input/output interface 57 and the media converter 58. Thereby, for example, it can be notified to an external monitor that the electrical power supply from the electric power system 4 has been interrupted and the operation of the power converter 20 has stopped.

Figure 4:
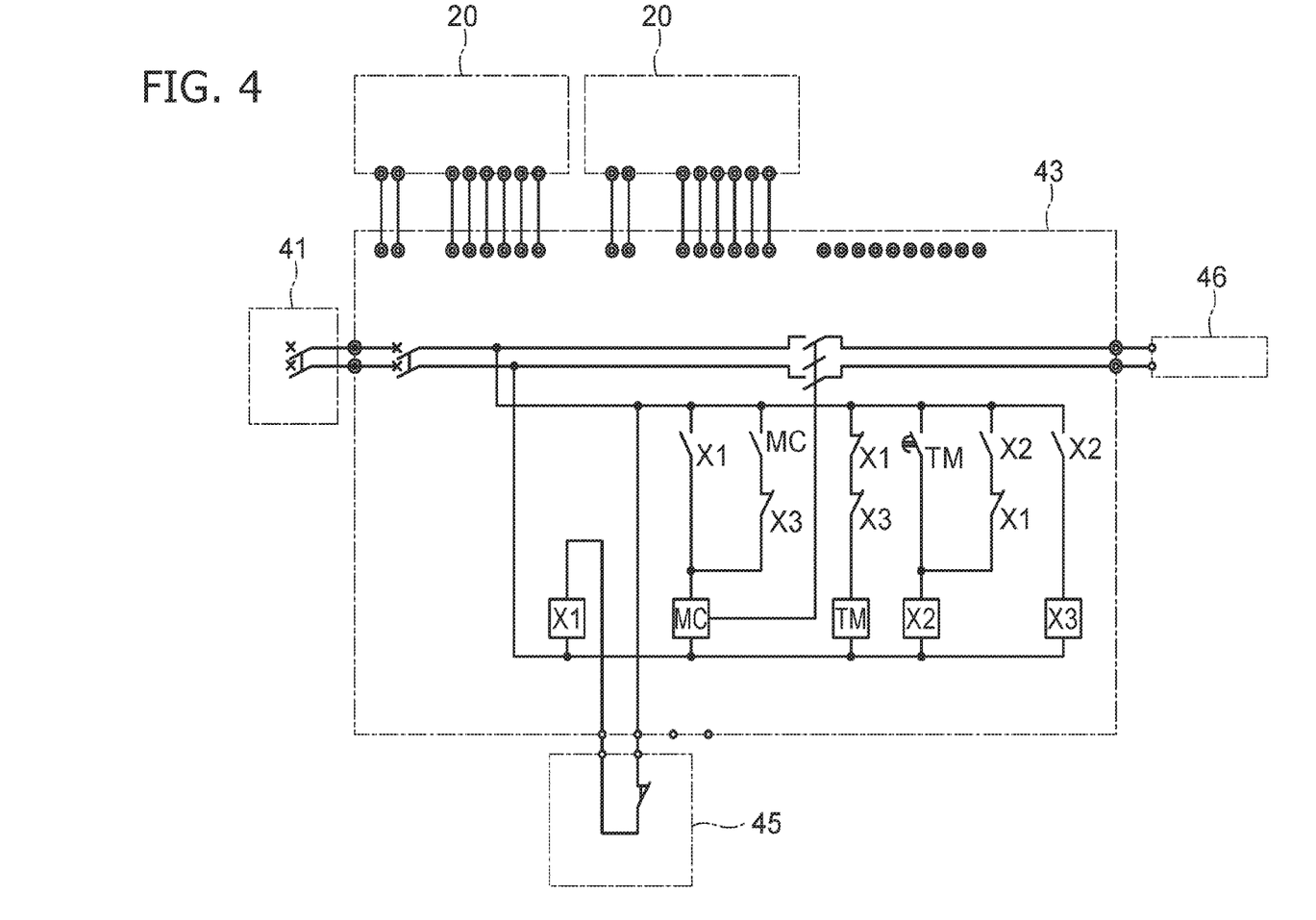
FIG. 4 is a circuit diagram schematically showing a portion of the control panel.

FIG. 4 is a circuit diagram schematically showing a portion of the control panel.

As shown in FIG. 4, the control panel 43 includes relays MC, X1, X2, and X3 and a timer TM. The temperature sensor 45, the relays MC, X1, X2, and X3, and the timer TM are provided on the electrical power supply path of the heater 46. In other words, the temperature sensor 45, the relays MC, X1, X2, and X3, and the timer TM are provided between the heater 46 and the transformer 50.

In the example, the temperature sensor 45 is a temperature switch. The temperature sensor 45 switches a contact from OFF to ON when the temperature inside the first storage room 11 becomes the prescribed value or less. For example, the temperature sensor 45 switches the contact when 0° C. or less.

When the temperature inside the first storage room 11 becomes 0° C. or less and the temperature sensor 45 is switched ON, the a-contacts of the relay X1 and the relay MC are switched ON; and electrical power is supplied to the heater 46. Also, at this time, because the b-contact of the relay X1 is switched OFF, the timer TM does not operate. Thereby, the interior of the first storage room 11 is heated by the heater 46.

When the temperature inside the first storage room 11 becomes higher than 0° C. by the heating of the heater 46, the a-contact of the relay X1 is switched OFF. At this time, the relay MC is in a self-holding state due to the path of the a-contact of the relay MC and the b-contact of the relay X3; and the electrical power supply to the heater 46 is continued. Simultaneously, the timer TM operates due to the b-contacts of the relay X1 and the relay X3. The timer TM is a time delay operating contact. The timer TM switches the contact from OFF to ON after a prescribed amount of time has elapsed from the point in time when the electrical power was supplied. For example, the timer TM switches the contact ON 10 minutes after the electrical power supply.

When the contact of the timer TM is switched ON, the a-contact of the relay X2 is switched ON; and the b-contact of the relay X3 is switched OFF. Thereby, the a-contact of the relay MC is switched OFF; and the electrical power supply to the heater 46 is stopped.

Thus, in the example, the heating inside the first storage room 11 is started by the temperature inside the first storage room 11 becoming 0° C. or less; and the heating inside the first storage room 11 is stopped 10 minutes after the point in time when the temperature inside the first storage room 11 becomes higher than 0° C. Thereby, the undesirable switching of the heater 46 ON/OFF repeatedly at a room temperature in the vicinity of 0° C. can be suppressed.

As described above, the air conditioners 14 and 15 adjust the temperature inside the first storage room 11 to be 30° C. or less. In other words, the temperature inside the first storage room 11 is controlled by the air conditioners 14 and 15 and the heater 46 to be higher than 0° C. but not more than 30° C. Thereby, for example, the degradation over time of the battery 40b of the uninterruptible power supply 40 can be suppressed.

The detected temperature of the temperature sensor 45 is not limited to 0° C.; and, for example, it is sufficient for the detected temperature of the temperature sensor 45 to be appropriately determined according to the temperature resistance of the battery 40b, etc. The delay time of the timer TM is not limited to 10 minutes and may be any time. The ON/OFF control of the heater 46 is not limited to a relay circuit such as that recited above and may be controlled using, for example, a microcomputer, etc.

Figure 5:
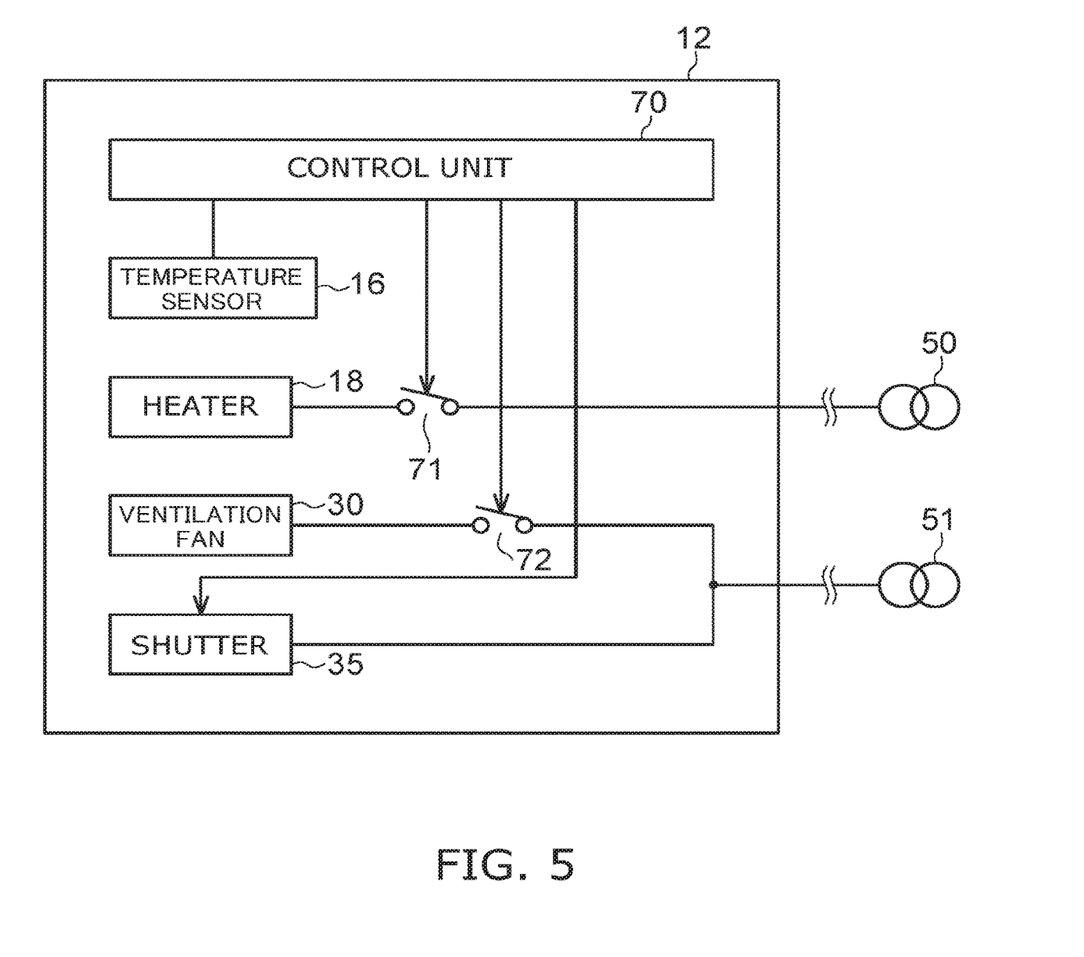
FIG. 5 is a functional block diagram schematically showing a portion of the second storage room.

FIG. 5 is a functional block diagram schematically showing a portion of the second storage room.

As shown in FIG. 5, the second storage room 12 further includes a control unit 70 and switches 71 and 72. The switch 71 is provided between the heater 18 and the transformer 50. The switch 71 switches between the supply of the electrical power to the heater 18 and stopping the electrical power supply. The switch 72 is provided between the ventilation fan 30 and the transformer 51. The switch 72 switches between the supply of the electrical power to the ventilation fan 30 and stopping the electrical power supply. The electrical power supply to the heater 18, the ventilation fan 30, and the shutter 35 is not limited to being from the transformers 50 and 51 and may be supplied from, for example, the uninterruptible power supply 40, etc.

The control unit 70 is connected to the temperature sensor 16, the shutter 35, and the switches 71 and 72. The temperature sensor 16 inputs the sensing result of the temperature inside the second storage room 12 to the control unit 70. The control unit 70 transmits a control signal to the shutter 35. The shutter 35 opens and closes the intake 34 according to the control signal from the control unit 70. Thus, the control unit 70 controls the opening and closing of the shutter 35. The control unit 70 is connected to a control terminal of each of the switch 71 and the switch 72 and switches the switch 71 and the switch 72 ON/OFF. In other words, the control unit 70 controls the electrical power supply to the heater 18 and the ventilation fan 30 and stopping the electrical power supply. Thus, the control unit 70 controls the operations of the heater 18, the ventilation fan 30, and the shutter 35. The control unit 70 may be provided in the first storage room 11. For example, the control unit 70 may be provided in the control panel 43. For example, the control unit 70 may be built into the indoor units 21 and 23 or the outdoor units 22 and 24.

Although the illustration in FIG. 5 is simplified, the configurations of each of the four ventilation fans 30 and the four shutters 35 are similar to those recited above. The control unit 70 individually controls the operations of each of the four ventilation fans 30 and the four shutters 35.

Figure 6:
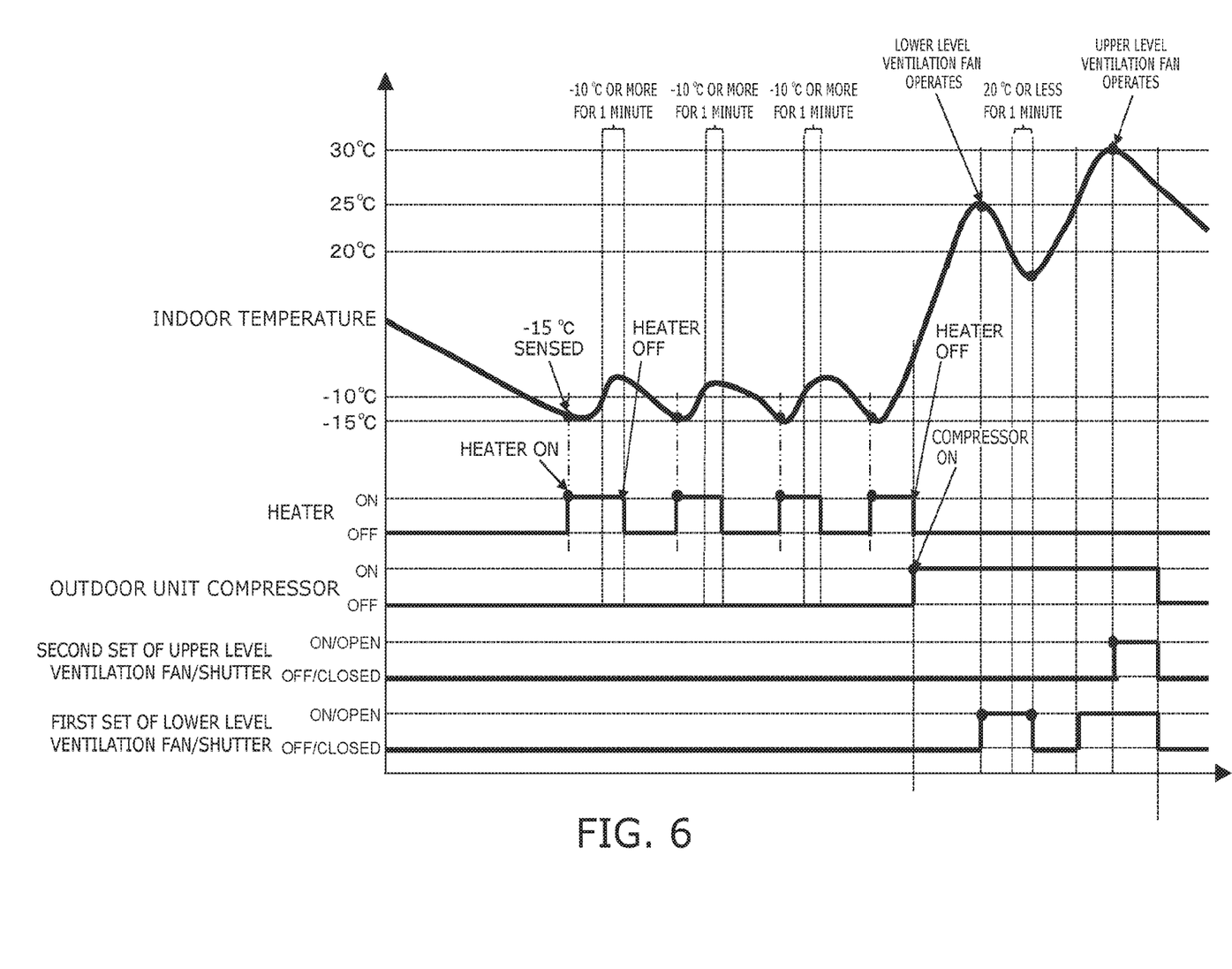
FIG. 6 is a graph schematically showing an example of the operation of the control unit.

FIG. 6 is a graph schematically showing an example of the operation of the control unit.

FIG. 6 schematically shows the temperature inside the second storage room 12 and the operations of the heater 18, the outdoor units 22 and 24, the ventilation fan 30, and the shutter 35.

As shown in FIG. 6, when the temperature inside the second storage room 12 sensed by the temperature sensor 16 becomes −15° C. or less, the control unit 70 switches the switch 71 from OFF to ON, supplies the electrical power to the heater 18, and drives the heater 18. Thus, for example, when the temperature sensed by the temperature sensor 16 is −15° C. or less, the heater 18 heats inside the second storage room 12. The temperature at which the driving of the heater 18 is started is not limited to −15° C. It is sufficient for the temperature at which the driving of the heater 18 is started to be appropriately determined according to the temperature resistance of the outdoor units 22 and 24, etc.

The control unit 70 starts timing a constant amount of time from the point in time when the temperature sensed by the temperature sensor 16 becomes not less than −10° C. after the heater 18 is driven. The time for which the control unit 70 performs the timing is, for example, 1 minute. The time of the timing is not limited to 1 minute and may be any time.

When the state of being not less than −10° C. has continued for 1 minute, the control unit 70 switches the switch 71 from ON to OFF, stops the supply of the electrical power to the heater 18, and stops the heater 18. Also, in the case where the temperature again becomes lower than −10° C. before 1 minute has elapsed, the control unit 70 stops the timing and continues the driving state of the heater 18.

Thus, the heater 18 starts the heating when −15° C. or less and stops the heating when the state of being not less than −10° C. has continued for 1 minute. Thereby, the interior of the second storage room 12 can be heated appropriately. Also, the undesirable switching of the heater 18 ON/OFF repeatedly can be suppressed. The temperature at which the timing is started is not limited to −10° C. and may be any value higher than the temperature at which the driving of the heater 18 is started. In the example, it is sufficient for the temperature to be higher than −15° C.

When the temperature inside the second storage room 12 sensed by the temperature sensor 16 becomes 25° C. or more, the control unit 70 switches the switches 72 of the two ventilation fans 30 of the four ventilation fans 30 disposed at the lower level from OFF to ON, supplies electrical power to the two ventilation fans 30 of the lower level, and drives the two ventilation fans 30. Thus, the two ventilation fans 30 of the lower level perform ventilation inside the second storage room 12 when the temperature sensed by the temperature sensor 16 is 25° C. or more.

Also, with the driving start of the two ventilation fans 30, the control unit 70 transmits control signals to the two shutters 35 of the four shutters 35 disposed at the front surface and the back surface and opens the two intakes 34 by driving the two shutters 35. Thereby, the external air is introduced to the second storage room 12; the interior of the second storage room 12 is ventilated; and the interior of the second storage room 12 is cooled.

After starting the driving of the two ventilation fans 30 of the lower level and opening the two intakes 34, the control unit 70 starts timing 1 minute from the point in time when the temperature sensed by the temperature sensor 16 becomes 20° C. or less. Similarly to the case of the heater 18, the time of the timing may be any time.

When the state of being 20° C. or less has continued for 1 minute, the control unit 70 switches the switches 72 from ON to OFF, stops the supply of the electrical power to the two ventilation fans 30, and stops the two ventilation fans 30. Also, the control unit 70 transmits control signals to the two shutters 35 and closes the two opened intakes 34. In the case where the temperature again becomes higher than 20° C. before 1 minute has elapsed, the control unit 70 stops the timing and continues the driving state of the two ventilation fans 30 and the open state of the two intakes 34.

In the case where the temperature sensed by the temperature sensor 16 has become 30° C. or more after starting the driving of the two ventilation fans 30 of the lower level and opening the two intakes 34, the control unit 70 switches the switches 72 of the remaining two ventilation fans 30 disposed at the upper level from OFF to ON, supplies electrical power to the two ventilation fans 30 of the upper level, and drives the two ventilation fans 30. Simultaneously, the control unit 70 transmits control signals to the remaining two shutters 35 disposed at the side surface opposing the first storage room 11 and opens the remaining two intakes 34.

When the temperature sensed by the temperature sensor 16 becomes 20° C. or less after the control unit 70 performs the driving of the four ventilation fans 30 and the opening of the four intakes 34, the control unit 70 stops each of the ventilation fans 30 and closes each of the intakes 34 by processing similar to that of the two cases.

Also, in the case where the control unit 70 stops the compressors 22c and 24c of the outdoor units 22 and 24 in the state in which the two or four ventilation fans 30 are being driven, that is, in the case where the operations of the air conditioners 14 and 15 are stopped, the control unit 70 stops the operation of each of the ventilation fans 30 and closes each of the intakes 34.

Thus, the housing 10 contains the outdoor units 22 and 24 inside the second storage room 12 and controls the temperature inside the second storage room 12. Thereby, the power converter 20 can be operated even in an environment having a low external air temperature.

Although the operations of the heater 18, the ventilation fan 30, and the shutter 35 are controlled using the control unit 70 in the example, this is not limited thereto; and, for example, the control may be performed using a relay circuit, etc. In the example recited above, the operations of the heater 18, the ventilation fan 30, and the shutter 35 are controlled based on the sensing result of one temperature sensor 16. A temperature sensor for controlling the operation of the heater 18, a temperature sensor for controlling the operation of the ventilation fan 30, and a temperature sensor for controlling the operation of the shutter 35 may be provided in the case where the operation of each component is controlled by a relay circuit. In other words, multiple temperature sensors corresponding to the temperatures to be sensed may be provided.

Figure 7:
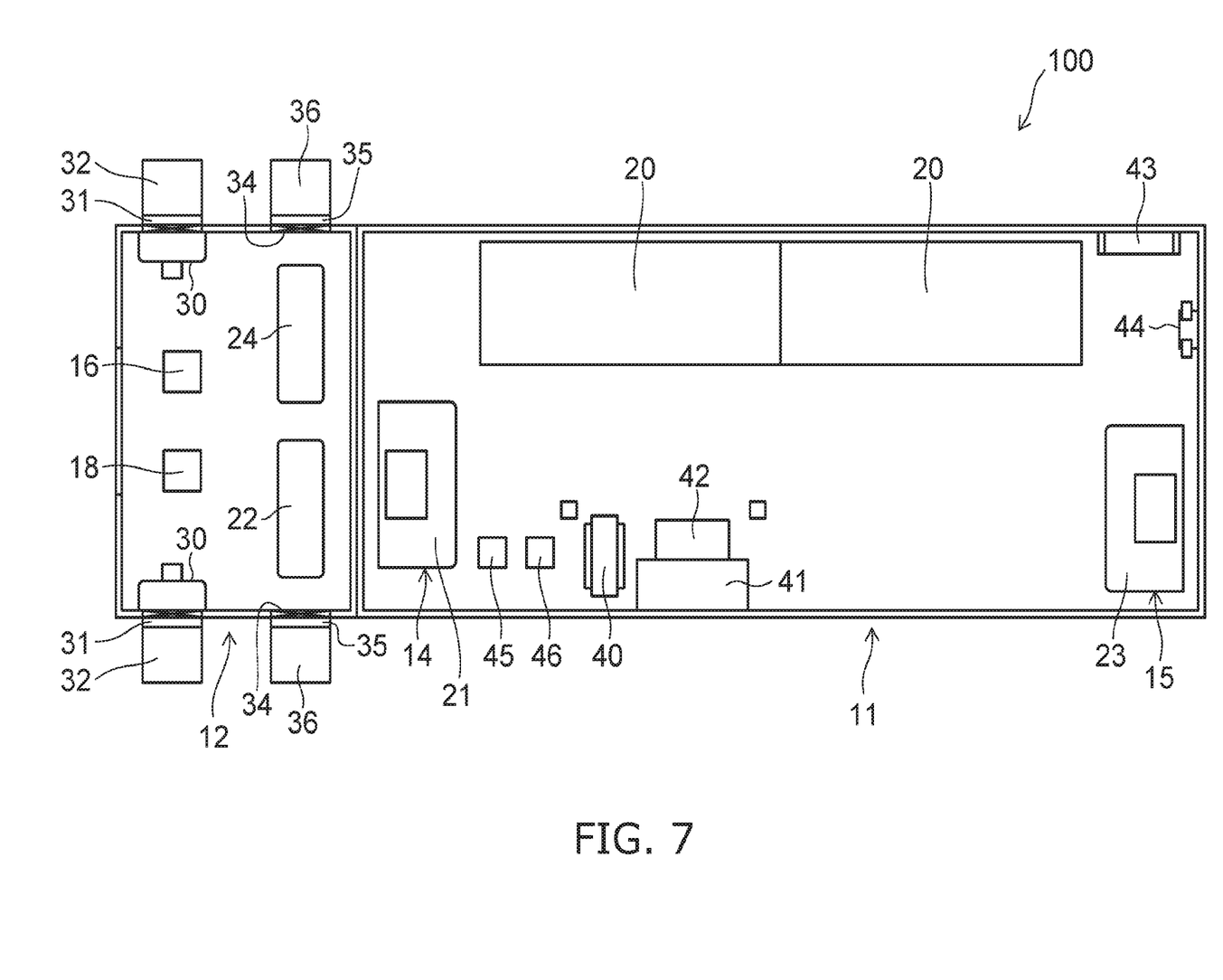
FIG. 7 is a site plan schematically showing another electrical equipment housing according to the embodiment.

FIG. 7 is a site plan schematically showing another electrical equipment housing according to the embodiment.

In the electrical equipment housing 100 as shown in FIG. 7, the second storage room 12 is one body with the first storage room 11. In the electrical equipment housing 100, for example, the first storage room 11 and the second storage room 12 are formed by partitioning one room. Thus, the second storage room 12 may be one body with the first storage room 11. However, by separating the second storage room 12 from the first storage room 11 as recited above, only the first storage room 11 can be used in the case where, for example, low temperature countermeasures of the outdoor units 22 and 24 are necessary. In other words, the first storage room 11 can be shared between a housing for which the low temperature countermeasure is necessary and a housing for which the low temperature countermeasure is unnecessary. Thereby, for example, the manufacturing cost of the electrical equipment housing can be suppressed.

Figure 8:
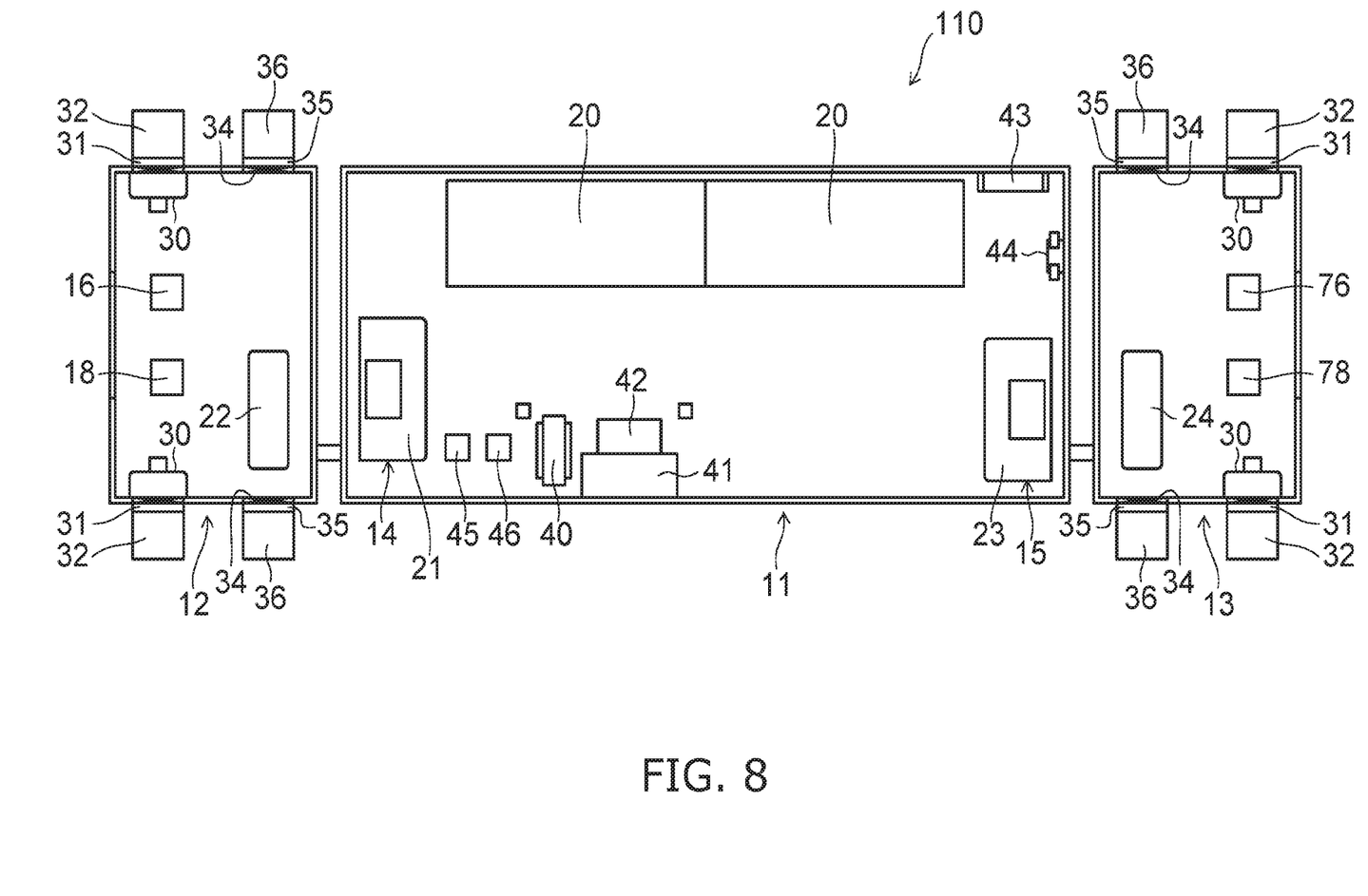
FIG. 8 is a site plan schematically showing another electrical equipment housing according to the embodiment.

FIG. 8 is a site plan schematically showing another electrical equipment housing according to the embodiment.

As shown in FIG. 8, the electrical equipment housing 110 further includes a third storage room 13. In the electrical equipment housing 110, the second storage room 12 contains the outdoor unit 22 of the air conditioner 14; and the third storage room 13 contains the outdoor unit 24 of the air conditioner 15. In the example, the second storage room 12 and the third storage room 13 are separated from the first storage room 11. The second storage room 12 and the third storage room 13 may be one body with the first storage room 11.

The electrical equipment housing 110 includes a temperature sensor 76 and a heater 78. The temperature sensor 76 senses the temperature inside the third storage room 13. When the temperature sensed by the temperature sensor 76 is a lower limit or less, the heater 78 heats inside the third storage room 13. The function and configuration of the third storage room 13 are substantially the same as those of the second storage room 12; and a detailed description is therefore omitted.

The second storage room 12 is disposed at one end side in the longitudinal direction of the first storage room 11. The third storage room 13 is disposed at the other end side in the longitudinal direction of the first storage room 11. In other words, the third storage room 13 is disposed on the opposite side of the second storage room 12 with the first storage room 11 interposed. Thus, the second storage room 12 is disposed to be proximal to the indoor unit 21. The third storage room 13 is disposed to be proximal to the indoor unit 23. Thereby, for example, the connection between the indoor unit 21 and the outdoor unit 22 and the connection between the indoor unit 23 and the outdoor unit 24 can be easy.

Thus, in the case where multiple air conditioners are mounted, the number of storage rooms that are prepared may correspond to the number of outdoor units. However, as recited above, by disposing the multiple outdoor units to be arranged inside the second storage room 12, for example, the manufacturing cost of the electrical equipment housing can be suppressed. Also, by considering the intake of the exhausted hot air, even in the case where one outdoor unit is provided inside the storage room, the distance from the front surface of the outdoor unit to the wall surface of the storage room cannot be much shorter. Therefore, in the case where storage rooms are provided for each of multiple outdoor units, for example, the electrical equipment housing undesirably is larger. As shown in the electrical equipment housing 10, the multiple outdoor units are arranged inside the second storage room 12. Thereby, for example, the enlargement of the electrical equipment housing can be suppressed.

According to the embodiments, an electrical equipment housing in which a power converter can be operated even in an environment having a low external air temperature while suppressing the decrease of the durability of the power converter is provided.

Hereinabove, embodiments of the invention are described with reference to specific examples. However, the embodiments of the invention are not limited to these specific examples. For example, one skilled in the art may similarly practice the invention by appropriately selecting specific configurations of components included in electrical equipment housings such as first storage rooms, second storage rooms, air conditioners, indoor units, outdoor units, temperature sensors, heaters, ventilation fans, intakes, and shutters etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all electrical equipment housings practicable by an appropriate design modification by one skilled in the art based on the electrical equipment housings described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. An electrical equipment housing, comprising:
    a first storage room containing a power converter converting electrical power;
    an air conditioner adjusting a temperature inside the first storage room, the air conditioner including an indoor unit and an outdoor unit, the indoor unit being provided inside the first storage room, the outdoor unit being provided outside the first storage room, the outdoor unit having a front surface and an outlet, the outlet being provided on the front surface, the outdoor unit being configured to blow air from the outlet forward relative to the front surface, wherein the outdoor unit houses a compressor, a fan, and a heat exchanger;
    a second storage room containing the outdoor unit, the second storage room having an opposing wall surface facing the front surface of the outdoor unit, a distance from the front surface of the outdoor unit to the opposing wall surface of the second storage room being 1000 mm or more;
    a first temperature sensor being disposed in the second storage room and being apart from the outdoor unit, the first temperature sensor sensing a first temperature inside the second storage room; and
        a first heater being disposed in the second storage room and being apart from the outdoor unit, the first heater heating air in the second storage room when the first temperature sensed by the first temperature sensor is a lower limit or less, the first heater operating by electrical power, the lower limit being higher than a temperature at which refrigerant floodback phenomenon occurs in the outdoor unit.

2. The electrical equipment housing according to claim 1, wherein
    two of the air conditioners are provided, and
    the outdoor units of the two air conditioners are arranged inside the second storage room.

3. The electrical equipment housing according to claim 2, wherein
    a distance between centers of the two outdoor units is 1000 mm or more.

4. The electrical equipment housing according to claim 1, wherein
    the first heater stops the heating when a state continues for a constant amount of time in which the first temperature is higher than the lower limit but not less than a prescribed value.

5. The electrical equipment housing according to claim 1, wherein
    the second storage room includes a ventilation fan performing ventilation inside the second storage room when the first temperature sensed by the first temperature sensor is an upper limit or more.

6. The electrical equipment housing according to claim 5, wherein the ventilation fan is disposed in front of the front surface of the outdoor unit in a blowing direction that the outdoor unit blows air.

7. The electrical equipment housing according to claim 5, wherein
    the second storage room further includes an intake and a shutter, the intake being for introducing external air into the second storage room, the shutter opening the intake when the ventilation fan operates and closing the intake when the ventilation fan is stopped.

8. The electrical equipment housing according to claim 7, wherein the intake and the shutter are disposed rearward of the front surface of the outdoor unit in a blowing direction that the outdoor unit blows air.

9. The electrical equipment housing according to claim 1, further comprising:
    a third storage room;
    a second temperature sensor sensing a second temperature inside the third storage room; and
    a second heater heating inside the third storage room when the second temperature sensed by the second temperature sensor of the third storage room is a lower limit or less, the second heater operating by electric power,
    two of the air conditioners being provided,
    the second storage room containing one outdoor unit of the two air conditioners, and
    the third storage room containing the other outdoor unit of the two air conditioners.

10. The electrical equipment housing according to claim 2, wherein
    a distance between a side surface of each of the two outdoor units and the wall surface of the second storage room is 200 mm or more.

* * * * *